(12) United States Patent
Lee et al.

(10) Patent No.: US 11,183,653 B2
(45) Date of Patent: Nov. 23, 2021

(54) FLEXIBLE DISPLAY DEVICE HAVING A MICRO COATING LAYER COVERED CIRCUIT WIRE

(71) Applicant: LG Display Co., Ltd., Seoul (KR)

(72) Inventors: Junjae Lee, Paju-si (KR); DongWon Jang, Gumi-si (KR); LokDam Baek, Paju-si (KR); Dohyun Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/858,044

(22) Filed: Apr. 24, 2020

(65) Prior Publication Data

US 2021/0126209 A1 Apr. 29, 2021

(30) Foreign Application Priority Data

Oct. 28, 2019 (KR) .................. 10-2019-0134603

(51) Int. Cl.
*H01L 51/00* (2006.01)
*H01L 51/52* (2006.01)
*H01L 27/32* (2006.01)

(52) U.S. Cl.
CPC ........ *H01L 51/0097* (2013.01); *H01L 27/323* (2013.01); *H01L 27/3248* (2013.01); *H01L 27/3279* (2013.01); *H01L 51/524* (2013.01); *H01L 51/529* (2013.01); *H01L 51/5253* (2013.01); *H01L 51/5281* (2013.01); *H01L 51/5246* (2013.01); *H01L 2251/5338* (2013.01)

(58) Field of Classification Search
CPC ............... H01L 51/0097; H01L 51/524; H01L 51/5253; H01L 51/5281; H01L 51/529; H01L 27/323; H01L 27/3248; H01L 27/3279; H01L 51/5246; H01L 2251/5338
See application file for complete search history.

(56) References Cited

U.S. PATENT DOCUMENTS

| | | | | |
|---|---|---|---|---|
| 10,182,474 B2* | 1/2019 | Kim | ............... | H01L 51/0097 |
| 10,236,471 B2* | 3/2019 | Oh | ............... | H01L 27/3244 |
| 10,388,713 B2* | 8/2019 | Son | ............... | H01L 51/0097 |
| 10,490,770 B2* | 11/2019 | Kim | ............... | G06F 1/1637 |
| 10,535,837 B2* | 1/2020 | Chung | ............... | H01L 51/524 |
| 10,637,007 B1* | 4/2020 | Wang | ............... | H01L 27/3262 |
| 10,658,436 B2* | 5/2020 | Shin | ............... | H01L 51/56 |
| 10,691,246 B2* | 6/2020 | Yoo | ............... | H01L 27/323 |
| 10,693,089 B2* | 6/2020 | He | ............... | H01L 51/0097 |

(Continued)

FOREIGN PATENT DOCUMENTS

KR 10-2017-0106589 A 9/2017

*Primary Examiner* — Ida M Soward
(74) *Attorney, Agent, or Firm* — Fenwick & West LLP

(57) ABSTRACT

A flexible display device may include a display panel including a display area and a bending area which extends on one side of the display area and is bent, first and second back plates disposed on a rear surface of the display panel, a thin film transistor and a light emitting element disposed on the display area, a circuit wire disposed on the display area and the bending area, a micro coating layer disposed on the circuit wire of the bending area, and a support member disposed between the first and second back plates and constituted by an adhesive and a cushion tape attached to a part of the rear surface of the adhesive, and a heat dissipation sheet attached to the rear surfaces of the cushion tape and the adhesive.

20 Claims, 10 Drawing Sheets

(56) References Cited

U.S. PATENT DOCUMENTS

| | | | |
|---|---|---|---|
| 10,707,194 B2* | 7/2020 | Odaka | H01L 51/0097 |
| 10,748,976 B2* | 8/2020 | Nishimura | H01L 27/3246 |
| 10,748,980 B2* | 8/2020 | Cho | H01L 51/0097 |
| 10,802,629 B2* | 10/2020 | Jeon | G06F 1/1656 |
| 10,816,713 B2* | 10/2020 | Miyazaki | G02B 6/0068 |
| 10,866,444 B2* | 12/2020 | You | H01L 51/0097 |
| 10,892,312 B2* | 1/2021 | Won | H01L 51/56 |
| 10,896,948 B2* | 1/2021 | Lee | H01L 27/3276 |
| 2017/0263891 A1 | 9/2017 | Oh et al. | |
| 2019/0173052 A1 | 6/2019 | Oh et al. | |
| 2019/0340959 A1* | 11/2019 | Park | H01L 51/5246 |
| 2020/0075900 A1* | 3/2020 | Seo | B23K 26/032 |
| 2020/0194516 A1* | 6/2020 | Kim | H01L 51/5237 |
| 2020/0203641 A1* | 6/2020 | Lee | G02F 1/133305 |
| 2020/0295303 A1* | 9/2020 | Nishimura | H01L 27/323 |
| 2021/0159221 A1* | 5/2021 | Li | H01L 51/529 |

\* cited by examiner

FLEXIBLE DISPLAY DEVICE HAVING A MICRO COATING LAYER COVERED CIRCUIT WIRE

CROSS-REFERENCE TO RELATED APPLICATION

This application claims priority to Republic of Korea Patent Application No. 10-2019-0134603 filed on Oct. 28, 2019, in the Korean Intellectual Property Office, the disclosure of which is incorporated by reference in its entirety.

BACKGROUND

Field

The present disclosure relates to a flexible display device, and more particularly, to a flexible display device in which a bezel width can be reduced.

Description of the Related Art

As an information age enters, the field of display devices for visually displaying electrical information signals is rapidly developing, and researches for developing performances such as thinning, weight reduction, and low power consumption for various display devices continue.

Typical display devices include a liquid crystal display device (LCD), a field emission display device (FED), an electro-wetting display device (EWD), an organic light-emitting display Device (OLED), and the like.

Since the electroluminescence emitting display device represented as the organic light emitting display device as a self-luminous display device does not require a separate light source unlike the liquid crystal display device, the electroluminescence emitting display device can be manufactured lightly and thinly. Further, the electroluminescence emitting display device is not only advantageous in terms of power consumption by low voltage driving, but also has excellent color implementation, response speed, viewing angle, and contrast ratio (CR), so the electroluminescence emitting display device is expected to be utilized in various fields.

In the electroluminescence emitting display device, an emissive layer (EML) is disposed between two electrodes constituted by an anode and a cathode. When holes in the anode are injected into an emissive layer and electrons in the cathode are injected into the emissive layer, the emissive layer emits light by forming excitons when the injected electrons and holes are recoupled with each other.

The emissive layer contains a host material and a dopant material so that an interaction between the both materials occurs and a host generates the excitons from the electrons and the holes and transfers energy to a dopant and the dopant as a dye organic material added in a small amount receives the energy from the host and converts the energy into light.

The electroluminescence emitting display device blocks the inflow of moisture or oxygen into the electroluminescence emitting display device from the outside by encapsulating the electroluminescence emitting display device with glass, metal, or a film to suppress oxidation of the emissive layer or the electrode and protect mechanical or physical impacts applied from the outside.

SUMMARY

An object to be achieved by the present disclosure is to an effort to reduce a bezel area that is an outer portion of a display area in order to increase an effective display screen size in the same dimension of a display device as the display device is miniaturized.

However, since a wire and a driving circuit for driving a screen are disposed in a bezel area corresponding to a non-display area, there is a limit in reducing the bezel area.

In recent years, with respect to a flexible electroluminescence emitting display device capable of maintaining display performance even though the flexible electroluminescence emitting display device is bent by applying a flexible substrate of a flexible material such as plastic, there has been an effort to reduce the bezel area by bending the non-display area of the flexible substrate in order to reduce the bezel area while securing a dimension for the wire and the driving circuit.

The electroluminescence emitting display device using the flexible substrate such as the plastic is required to secure flexibility of various insulating layers disposed on the substrate and a wire made of a metallic material and suppress a defect such as a crack which may occur due to bending.

The insulating layer and the wire disposed in a bending area serve to suppress the crack and protect the wire from a foreign material by disposing a protective layer such as a micro coating layer on the wire and the insulating layer of the bending area and adjust a neutral plane of the bending area by coating with a predetermined thickness.

In the electroluminescence emitting display device which has been recently developed for miniaturization of the bezel area and thinning of the display device, the bending area of the flexible substrate has an extreme curvature and minimizes even the thickness of the micro coating layer.

In such a bending area, the crack occurs on the surface of the micro coating layer with the extreme curvature and the minimized thickness, and as a result, the defect may occur in the micro coating layer.

Meanwhile, in the flexible electroluminescence emitting display device, a curvature R is determined by a structure of a mechanism structure in a bezel and the curvature R increases with an increase in thickness of a cushion tape applied to absorb an impact from external force and a bezel width also increases with the increase in the curvature R.

Therefore, the inventors of the present disclosure recognize the above-mentioned problems and invent a flexible display device in which the thickness of the bezel area is reduced and the bezel width is reduced.

The present disclosure describes a flexible display device in which the thickness of the cushion tape is increased without increasing the thickness of the bezel area.

Objects of the present disclosure are not limited to the above-mentioned objects, and other objects, which are not mentioned above, can be clearly understood by those skilled in the art from the following descriptions.

According to an aspect of the present disclosure, a flexible display device may include a display panel including a display area and a bending area which extends on one side of the display area and is bent, first and second back plates disposed on a rear surface of the display panel, a thin film transistor and a light emitting element disposed on the display area, a circuit wire disposed on the display area and the bending area, a micro coating layer disposed on the circuit wire of the bending area, and a support member disposed between the first and second back plates and constituted by an adhesive and a cushion tape attached to a part of the rear surface of the adhesive, and a heat dissipation sheet attached to the rear surfaces of the cushion tape and the adhesive.

In another aspect of the present disclosure, a flexible display device may include a display panel including a first planar portion, a second planar portion, and a curve portion positioned between the first planar portion and the second planar portion, first and second back plates disposed on rear surfaces of the first and second planar portions of the display panel, respectively, a support member disposed between the first and second back plates and constituted by an adhesive and a cushion tape attached to a part of the rear surface of the adhesive, and a heat dissipation sheet attached to the rear surfaces of the cushion tape and the adhesive, and an adhesive tape disposed between the heat dissipation sheet attached onto the rear surface of the adhesive and the second back plate.

Other detailed matters of the exemplary embodiments are included in the detailed description and the drawings.

According to an exemplary embodiment of the present disclosure, a flexible display device provides an effect of reducing a bezel width by reducing a curvature R value of a bezel area.

Further, according to an exemplary embodiment of the present disclosure, a flexible display device has an effect of minimizing a defect in which a crack of a micro coating layer occurs in a bending area of a flexible substrate.

Further, according to an exemplary embodiment of the present disclosure, in a flexible display device, a thickness of a cushion tape can be increased, thereby effectively absorbing an impact by an external force.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
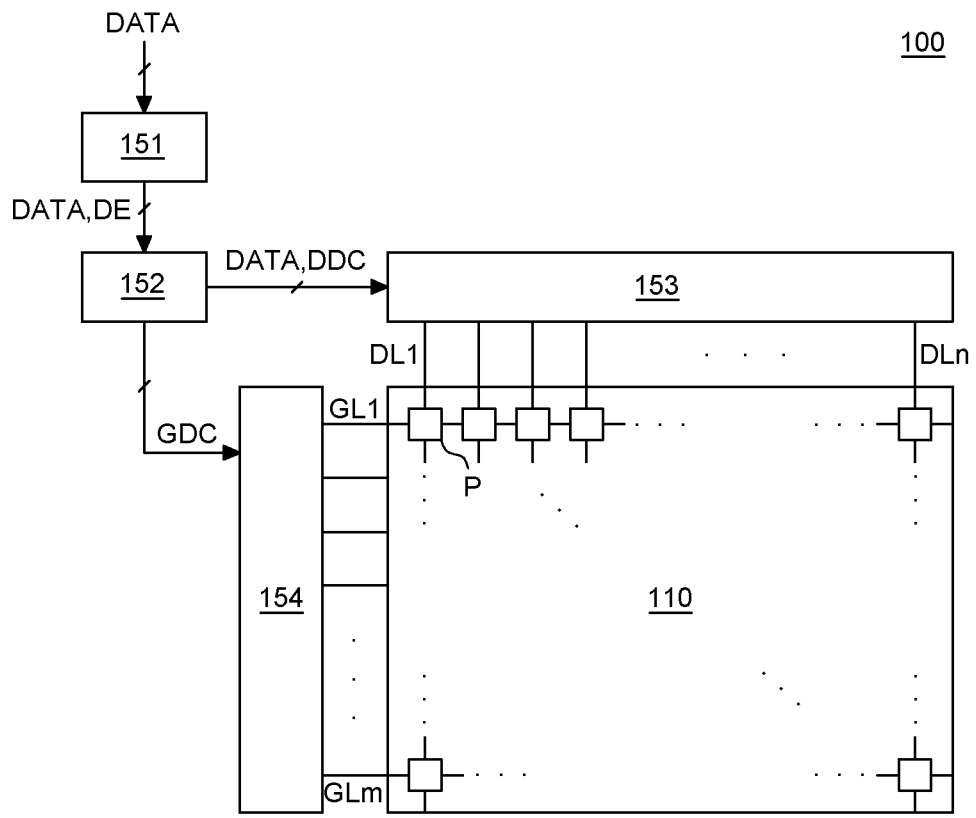
FIG. 1 is a block diagram of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a block diagram of a flexible display device according to an exemplary embodiment of the present disclosure.

Referring to FIG. 1, a flexible display device 100 according to an exemplary embodiment of the present disclosure may include an image processor 151, a timing controller 152, a data driver 153, a gate driver 154, and a display panel 110.

The image processor 151 may output a data signal DATA and a data enable signal DE supplied from outside the device 100. The image processor 151 may output one or more of a vertical synchronization signal, a horizontal synchronization signal, and a clock signal in addition to the data enable signal DE.

The timing controller 152 receives the data signal DATA from the image processor 151 in addition to a driving signal including the data enable signal DE or the vertical synchronization signal, the horizontal synchronization signal, and the clock signal. The timing controller 152 may output a gate timing control signal GDC for controlling an operation timing of the gate driver 154 and a data timing control signal DDC for controlling the operation timing of the data driver 153 based on the driving signal.

In response to the data timing control signal DDC supplied from the timing controller 152, the data driver 153 may sample and latch the data signal DATA supplied from the timing controller 152 and convert the sampled and latched data signal into gamma reference voltage and output the gamma reference voltage. The data driver 153 may output the data signal DATA through data lines DL1 to DLn.

The gate driver 154 may output a gate signal while shifting a level of gate voltage in response to the gate timing control signal GDC supplied from the timing controller 152. The gate driver 154 may output the gate signal through gate lines GL1 to GLm.

The display panel 110 may display an image while a sub pixel P emits light in response to the data signal DATA and the gate signal supplied from the data driver 153 and the gate driver 154. A detailed structure of the sub pixel P will be described in detail in FIGS. 2 and 4A and 4B.

Figure 2:
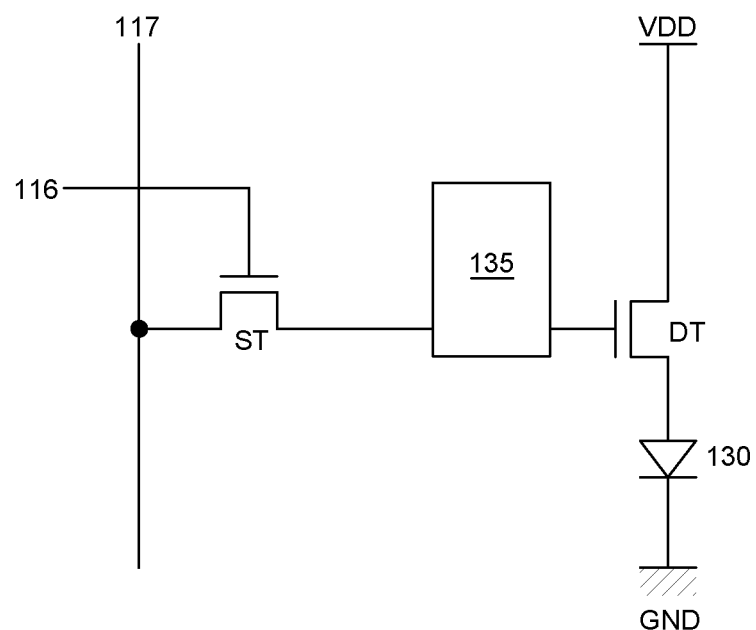
FIG. 2 is a circuit diagram of a sub pixel included in a flexible display device according to an exemplary embodiment of the present disclosure.

FIG. 2 is a circuit diagram of a sub pixel included in a flexible display device according to an exemplary embodiment of the present disclosure.

Referring to FIG. 2, the sub pixel of the flexible display device 100 according to an exemplary embodiment of the present disclosure may include a switching transistor ST, a driving transistor DT, a compensation circuit 135, and a light emitting element 130.

The light emitting element 130 may operate to emit light according to driving current formed by the driving transistor DT.

The switching transistor ST may perform a switching operation so that the data signal supplied through a data line 117 is stored in a capacitor as data voltage in response to the gate signal supplied through a gate line 116.

The driving transistor DT may operate so that constant driving current flows between a high potential power supply line VDD and a low potential power supply line GND in response to the data voltage stored in the capacitor.

The compensation circuit 135 may be a circuit for compensating threshold voltage of the driving transistor DT and the compensation circuit 135 may include one or more thin film transistors and capacitors. A configuration of the compensation circuit 135 may be significantly diversified depending on a compensation method.

For example, the sub pixel illustrated in FIG. 2 may be configured in a 2T(Transistor)1C(Capacitor) structure including the switching transistor ST, the driving transistor DT, the capacitor, and the light emitting element 130, but when the compensation circuit 135 is added, the sub pixel may be variously configured as 3T1C, 4T2C, 5T2C, 6T1C, 6T2C, 7T1C, 7T2C, etc.

Figure 3:
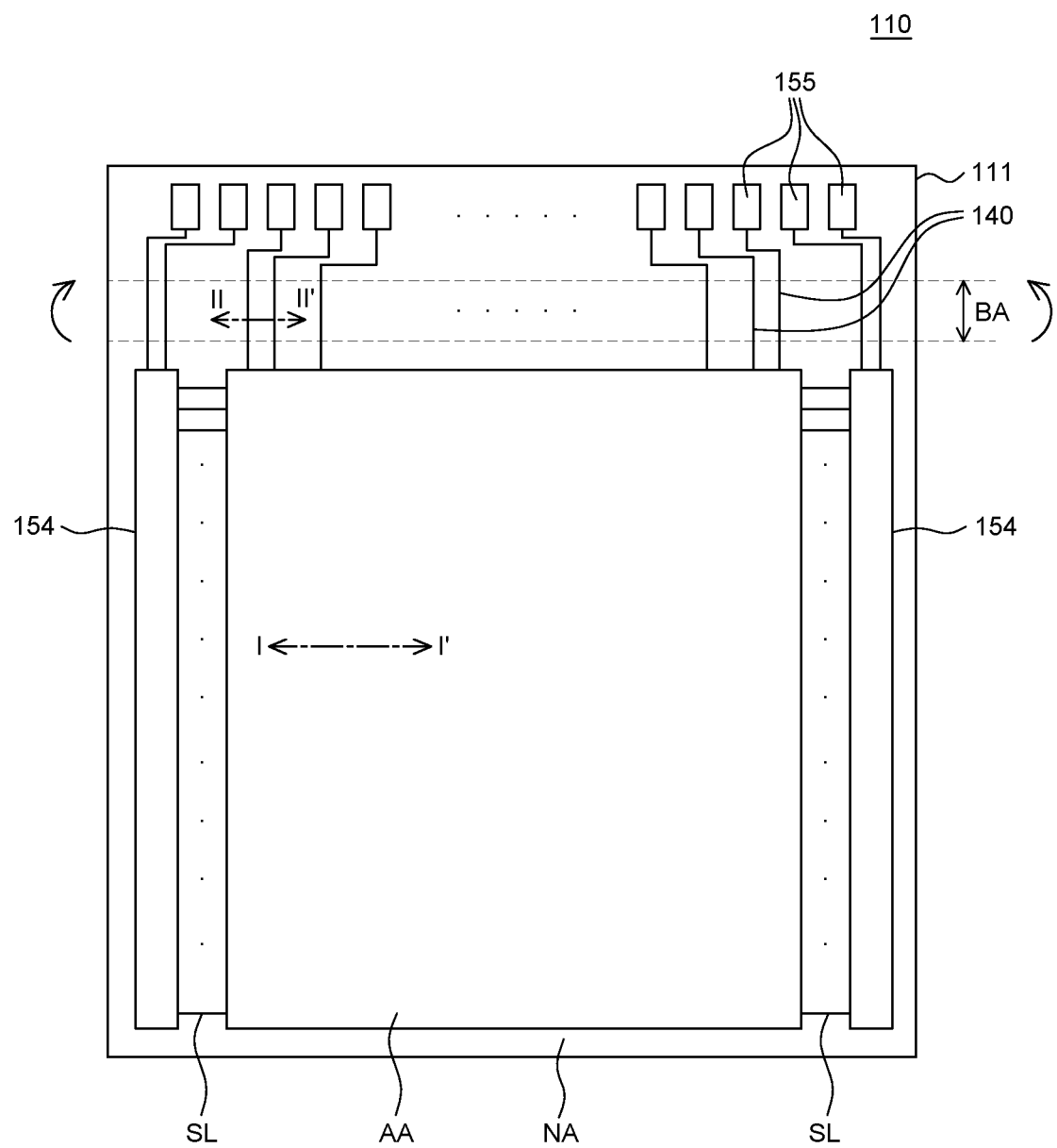
FIG. 3 is a plan view of a flexible display device according to an exemplary embodiment of the present disclosure.

FIG. 3 is a plan view of a flexible display device according to an exemplary embodiment of the present disclosure.

FIG. 3 illustrates a state in which a flexible substrate 111 of the flexible display device 110 according to an exemplary embodiment of the present disclosure is not bent by giving an example.

Referring to FIG. 3, the flexible display device 110 may include a display area AA in which a pixel actually emitting light through the thin film transistor and the light emitting element is disposed on the flexible substrate 111 and a non-display area NA which is a bezel area surrounding a periphery of the display area AA.

In the non-display area NA of the flexible substrate 111, a circuit such as a gate driver 154 for driving the flexible display device 110 and various signal wires such as a scan line (SL) may be disposed.

The circuit for driving the flexible display device 110 may be disposed on the substrate 111 by a gate in panel (GIP) scheme or connected to the flexible substrate 111 by a tape carrier package (TCP) or chip on film (COF) scheme.

A pad 155 which is a metal pattern is disposed on one side of the substrate 111 of the non-display area NA so that an external module may be bonded.

A part of the non-display area NA of the flexible substrate 111 is bent in a bending direction indicated by an arrow to form a bending area BA.

The non-display area NA of the flexible substrate 111 is an area where a wire and a driving circuit for driving a screen are disposed. Since the non-display area NA is not an area in which the image is displayed, the non-display area NA need not be viewed on the top surface of the flexible substrate 111. Accordingly, a partial area of the non-display area NA of the flexible substrate 111 is bent to reduce a bezel area BA while securing a dimension for the wire and the driving circuit.

Various wires may be formed on the flexible substrate 111. The wire may be formed in the display area AA of the substrate 111 or a circuit wire 140 formed in the non-display area NA may transfer a signal by connecting the driving circuit or the gate driver, the data driver, etc. to each other.

The circuit wire 140 may be made of a conductive material and made of a conductive material having excellent flexibility in order to suppress the crack at the time of bending the substrate 111. The circuit wire 140 may be made of a conductive material having excellent flexibility, such as gold (Au), silver (Ag), aluminum (Al), etc., or one of various conductive materials used in the display area AA. The circuit wire 140 may include molybdenum (Mo), chromium (Cr), titanium (Ti), nickel (Ni), neodymium (Nd), copper (Cu), or an alloy of silver (Ag) and magnesium (Mg).

The circuit wire 140 may be configured in a multilayer structure including various conductive materials and may be configured in a three-layered structure of titanium (Ti)/aluminum (Al)/titanium (Ti), but is not limited thereto.

When the circuit wire 140 formed in the bending area BA is bent, the circuit wire 140 receives tensile force. The circuit wire 140 which extends on the flexible substrate 111 in a direction which is the same as the bending direction receives the greatest tensile force, and as a result, the crack or disconnection may occur. Therefore, instead of forming the circuit wire 140 to extend in the bending direction, at least a portion of the circuit wire 140 disposed including the bending area BA is formed to extend in an oblique direction different from the bending direction, thereby minimizing the tensile force.

The circuit wire 140 disposed including the bending area BA may be formed in various shapes, and may be formed in a trapezoidal wave shape, a triangular wave shape, a saw tooth wave shape, a sinusoidal wave shape, an omega (Ω) shape, a rhombus shape, or the like.

Figure 4A:
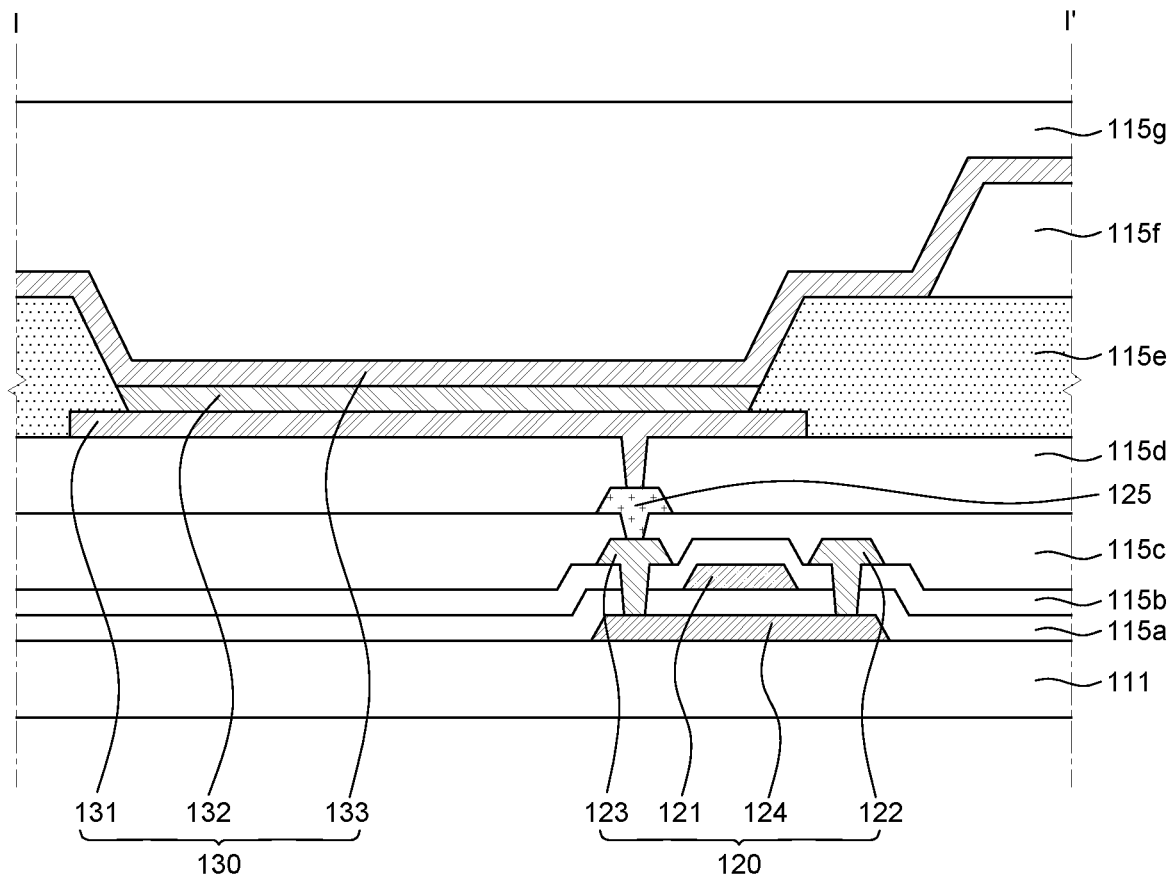
FIG. 4A is a cross-sectional view taken along line I-I' of FIG. 3 according to an exemplary embodiment of the present disclosure.

FIG. 4A is a cross-sectional view taken along line I-I' of FIG. 3 according to one embodiment.

Figure 4B:
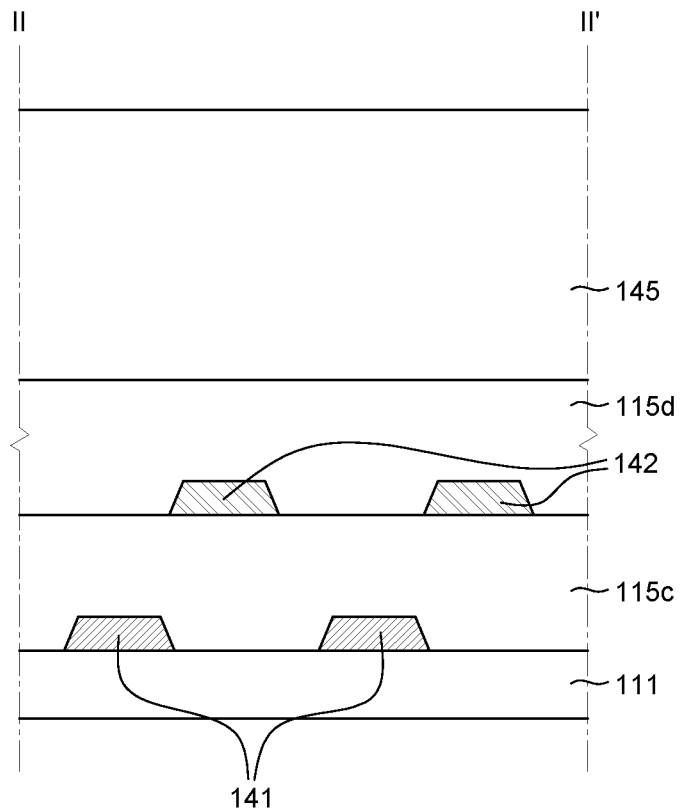
FIG. 4B is a cross-sectional view taken along line II-II' of FIG. 3 according to an exemplary embodiment of the present disclosure.

FIG. 4B is a cross-sectional view taken along line II-II' of FIG. 3 according to one embodiment.

FIG. 4A illustrates a detailed structure cross-section (I-I') of the display area AA described in FIG. 3.

Referring to FIG. 4A, the substrate 111 serves to support and protect components of the flexible display device 100, which are disposed thereon.

In recent years, the flexible substrate 111 may be made of a flexible material having a flexible property like plastic.

The flexible substrate 111 may be in the form of a film including one of a group comprising a polyester polymer, a silicone polymer, an acrylic polymer, a polyolefin polymer, and a copolymer thereof.

For example, the flexible substrate 111 may be composed by at least one of polyethylene terephthalate (PET), polybutylene terephthalate (PBT), polysilane, polysiloxane, polysilazane, polycarbosilane, polyacrylate, olymethacrylate, polymethylacrylate, polymethylmethacrylate, polyethylacrylate, polyethylmethacrylate, cyclic olefin copolymer (COC), cyclic olefin polymer (COP), polyethylene (PE), polypropylene (PP), polyimide (PI), polymethyl methacrylate (PMMA), polystyrene (PS), polyacetal (POM), polyetheretherketone (PEEK), polyestersulfone (PES), polytetrafluoroethylene (PTFE), polyvinylchloride (PVC), polycarbonate (PC), polyvinylidene fluoride (PVDF), a perfluoroalkyl polymer (PFA), a styrene acrylonitrile copolymer (SAN), or a combination thereof.

A buffer layer may be further formed on the flexible substrate 111. The buffer layer may suppress penetration of external moisture or other impurities through the flexible substrate 111 and planarize the surface of the flexible substrate 111. The buffer layer may not be a component which is particularly required and may be deleted depending on the type of thin film transistor 120 disposed on the flexible substrate 111.

The thin film transistor 120 may be disposed on the flexible substrate 111 and may include a gate electrode 121, a source electrode 122, a drain electrode 123, and a semiconductor layer 124.

In this case, the semiconductor layer 124 may be made of amorphous silicon or polycrystalline silicon but is not limited thereto. The polycrystalline silicon has better mobility than amorphous silicon and has low energy consumption and excellent reliability, and thus may be applied to driving thin film transistors in pixels.

The semiconductor layer 124 may be configured by an oxide semiconductor. The oxide semiconductor has excellent mobility and uniformity. The oxide semiconductor may be made of indium tin gallium zinc oxide (InSnGaZnO)-based materials which is a quaternary metal oxide, indium gallium zinc oxide (InGaZnO)-based material, indium tin zinc oxide (InSnZnO)-based material, and tin gallium zinc oxide (SnGaZnO)-based material, aluminum gallium zinc oxide (AlGaZnO)-based material, indium aluminum zinc oxide (InAlZnO)-based material, and tin aluminum zinc oxide (SnAlZnO)-based material which are ternary metal oxides, indium zinc oxide (InZnO)-based material, tin zinc oxide (SnZnO)-based material, aluminum zinc oxide (AlZnO)-based material, zinc magnesium oxide (ZnMgO)-based material, tin magnesium oxide (SnMgO)-based material, indium magnesium oxide (InMgO)-based material, indium gallium oxide (InGaO)-based Material, indium oxide (InO)-based material, tin oxide (SnO)-based material, and zinc oxide (ZnO)-based material which are binary metal oxides, and the like, and a composition ratio of each element is not limited.

The semiconductor layer 124 may include a source region including p or n type impurities, a drain region, and a channel region between the source region and the drain region and further include a low concentration doping area between the source region and the drain region adjacent to the channel region.

The source region and the drain region may be regions where the impurities are doped with a high concentration, and a source electrode 122 and a drain electrode 123 of the thin film transistor 120 may be connected to the source region and the drain region, respectively.

As impurity ions, p type impurities or n type impurities may be used, and the p type impurities may be one of boron (B), aluminum (Al), gallium (Ga), or indium (In) and the n-type impurities may be one of phosphorus (P), arsenic (As), or antimony (Sb).

In the semiconductor layer 124, the channel region may be doped with the n type impurities or the p type impurities according to the thin film transistor structure of NMOS or PMOS and as the thin film transistor included in the flexible display device 100 according to an exemplary embodiment of the present disclosure, a thin film transistor of NMOS or PMOS may be adopted.

A first insulating layer 115a may be an insulating layer a single layer of silicon oxide (SiOx) or silicon nitride (SiNx) or a plurality of layers thereof and may be disposed so that current flowing on the semiconductor layer 124 does not flow to the gate electrode 121. In addition, the silicon oxide has less flexibility than metal, but better flexibility than the silicon nitride and may be formed in a single layer or a plurality of layers according to characteristics thereof.

The gate electrode 121 serves as a switch that turns on or turns off the thin film transistor 120 based on an electrical signal transmitted from the outside through the gate line, and may be configured by in a single layer or a plurality of layers made of copper (Cu), aluminum (Al), molybdenum (Mo), chromium (Cr), gold (Au), titanium (Ti), nickel (Ni), or neodymium (Nd) as conductive metal or an alloy thereof, but is not limited thereto.

The source electrode 122 and the drain electrode 123 may be connected to the data line and may allow the electrical signal transmitted from the outside to be transmitted from the thin film transistor 120 to the light emitting element 130. The source electrode 122 and the drain electrode 123 may be configured by a single layer or a plurality of layers made of metallic materials including copper (Cu), aluminum (Al), molybdenum (Mo), chromium (Cr), gold (Au), titanium (Ti), nickel (Ni), or neodymium (Nd) as the conductive metal or an alloy thereof, but is not limited thereto.

In order to insulate the gate electrode 121, the source electrode 122, and the drain electrode 123 from each other, a second insulating layer 115b configured by a single layer or a plurality of layers of silicon oxide (SiOx) or silicon nitride (SiNx) may be disposed between the gate electrode 121, the source electrode 122, and the drain electrode 123.

A passivation layer including an inorganic insulating layer such as silicon oxide (SiOx) or silicon nitride (SiNx) may be further disposed on the thin film transistor 120.

The passivation layer may serve to suppress unnecessary electrical connection disposed between components disposed above and below the passivation layer and suppress contamination or damage from the outside and may be omitted depending on the configurations and the characteristics of the thin film transistor 120 and the light emitting element 130.

The thin film transistor 120 may be classified into an inverted staggered structure and a coplanar structure according to positions of components constituting the thin film transistor 120. For example, in the thin film transistor of the inverted staggered structure, the gate electrode may be positioned opposite to the source electrode and the drain electrode based on the semiconductor layer. As illustrated in FIG. 4A, in the thin film transistor 120 of the coplanar structure, the gate electrode 121 may be positioned on the same side as the source electrode 122 and the drain electrode 123 based on the semiconductor layer 124.

In FIG. 4A, the thin film transistor 120 of the coplanar structure is illustrated, but the flexible display device 100 according to an exemplary embodiment of the present disclosure may include the thin film transistor of the inverted staggered structure.

For convenience of description, only the driving thin film transistor is illustrated among various thin film transistors which may be included in the flexible display device 100 and a switching thin film transistor, a capacitor, etc., may be included in the flexible display device 100.

In addition, when the signal is applied to the switching thin film transistor from the gate line, the switching thin film transistor transmits the signal from the data line to the gate electrode of the driving thin film transistor. The driving thin film transistor may transmit current transmitted through the power wire to an anode 131 by the signal transmitted from the switching thin film transistor and control light emission by the current transmitted to the anode 131.

In order to protect the thin film transistor 120, mitigate a step caused by the thin film transistor 120, and reduce parasitic capacitance generated between the thin film transistor 120, the gate line and the data line, and the light emitting elements 130, planarization layers 115c and 115d may be disposed on the thin film transistor 120.

The planarization layers 115c and 115d may be made of at least one material of an acrylic resin, an epoxy resin, a phenolic resin, a polyamides resin, a polyimides resin, an unsaturated polyesters resin, a polyphenylene resin, a polyphenylenesulfides resin, or benzocyclobutene, but are not limited thereto.

The flexible display device 100 according to an exemplary embodiment of the present disclosure may include a first planarization layer 115c and a second planarization layer 115d which are sequentially laminated. In other words, the first planarization layer 115c may be disposed on the thin film transistor 120 and the second planarization layer 115d may be disposed on the first planarization layer 115c.

The buffer layer may be disposed on the first planarization layer 115c. The buffer layer may be configured by a plurality of layers of silicon oxide (SiOx) in order to protect the component disposed on the first planarization layer 115c and may be omitted depending on the configurations and the characteristics of the thin film transistor 120 and the light emitting element 130.

An intermediate electrode 125 may be connected to the thin film transistor 120 through a contact hole formed in the first planarization layer 115c. The intermediate electrode 125 may be laminated to be connected to the thin film transistor 120 and the data line may be formed in a multilayer structure.

The data line may be formed in a structure in which a lower layer made of the same material as the source electrode 122 and the drain electrode 123 and an upper layer made of the same material as the intermediate electrode 125 are connected. In other words, the data line may be implemented in a structure in which two layers are connected parallel to each other and in this case, wire resistance of the data line may be reduced.

Meanwhile, a passivation layer configured by the inorganic insulating layer such as silicon oxide (SiOx) or silicon nitride (SiNx) may be further disposed on the first planarization layer 115c and the intermediate electrode 125. The passivation layer may serve to suppress unnecessary electrical connection disposed between components and suppress contamination or damage from the outside and may be omitted depending on the configurations and the characteristics of the thin film transistor 120 and the light emitting element 130.

The light emitting element 130 disposed on the second planarization layer 115d may include the anode 131, a light emitting unit 132, and a cathode 133.

The anode 131 may be disposed on the second planarization layer 115d.

The anode 131 as an electrode serving to supply holes to the light emitting unit 132 is connected to the intermediate electrode 125 through the contact hole disposed in the second planarization layer 115d to be electrically connected to the thin film transistor 120.

The anode 131 may be made of indium tin oxide (ITO), indium zinc oxide (IZO), or the like, which is a transparent conductive material, but is not limited thereto.

When the flexible display device 100 is a top emission device that emits light to an upper portion where the cathode 133 is disposed, the flexible display device 100 may further include a reflective layer so that the emitted light is reflected on the anode 131 and more smoothly discharged in an upper direction in which the cathode 133 is disposed.

The anode 131 may be a two-layered structure in which a transparent conductive layer made of the transparent conductive material and the reflective layer are sequentially laminated or a three-layered structure in which the transparent conductive layer, the reflective layer, and the transparent conductive layer are sequentially laminated, and the reflective layer may be silver (Ag) or an alloy including silver.

A bank 115e disposed on the anode 131 and the second planarization layer 115d partitions a region which actually emits light to define the sub pixel. After a photoresist is formed on the anode 131, the bank 115e may be formed by photolithography. The photoresist refers to a photosensitive resin of which solubility for a development solution is changed by an action of light and the photoresist is exposed and developed to acquire a specific pattern. The photoresist may be classified into positive photoresist and negative photoresist. The positive photoresist refers to photoresist of which solubility for the development solution of an exposed portion is increased by exposure and when the positive photoresist is developed, a pattern from which the exposed portion is removed is acquired. The negative photoresist refers to photoresist of which solubility for the development solution of the exposed portion is significantly decreased by exposure and when the negative photoresist is developed, a pattern from which a non-exposed portion is removed is acquired.

A fine metal mask (FMM) which is a deposition mask may be used in order to form the light emitting unit 132 of the light emitting element 130.

In addition, in order to suppress damage which may occur in contact with the deposition mask disposed on the bank 115e and maintain a predetermined distance between the bank 115e and the deposition mask, a spacer 115f made of one of polyimide, photoacryl, and benzocyclobutene (BCB) which are transparent organic materials may be disposed above the bank 115e.

The light emitting unit 132 may be disposed between the anode 131 and the cathode 133.

The light emitting unit 132 may serve to emit light and include at least one layer of a hole injection layer (HIL), a hole transport layer (HTL), an emissive layer, an electron transport layer (ETL), and an electron injection layer (EIL) and, and some components may be omitted depending on the structure or characteristics of the flexible display device 100. Here, the emissive layer may adopt a field emissive layer and an inorganic emissive layer.

The hole injection layer is disposed on the anode 131 to serve to facilitate injection of holes.

The hole transport layer is disposed on the hole injection layer to smoothly transfer the holes to the emissive layer.

The emissive layer may be disposed on the hole transport layer and may include a material capable of emitting light of a specific color and emit the light of the specific color. In addition, a light emitting material may be formed by using a phosphor or a fluorescent material.

The electron injection layer may be further disposed on the electron transport layer. The electron injection layer as an organic layer which facilitates injection of the electrons from the cathode 133 may be omitted according to the structure and characteristics of the flexible display device 100.

Meanwhile, an electron blocking layer or a hole blocking layer which blocks a flow of the holes or electrons is further disposed at a position adjacent to the emissive layer to suppress a phenomenon in which when the electrons are injected into the emissive layer, the electrons move on the emissive layer and pass through the adjacent hole transport layer or when the holes are injected into the emissive layer, the holes move on the emissive layer and pass through the adjacent electron transport layer, thereby enhancing light emitting efficiency.

The cathode 133 is disposed on the light emitting unit 132 to serve to supply the electrons to the light emitting unit 132. Since the cathode 133 should supply the electrons, the cathode may be made of a metallic material such as magnesium (Mg), silver-magnesium (Ag:Mg), or the like, which is a conductive material having a low work function, but is not limited thereto.

When the flexible display device 100 has a top emission scheme, the cathode 133 may be indium tin oxide (ITO), indium zinc oxide (IZO), indium tin zinc oxide (ITZO), zinc oxide (ZnO), or tin oxide (TO)-based transparent conductive oxides.

An encapsulation unit 115g for suppressing the thin film transistor 120 and the light emitting element 130 which are the components of the flexible display device 100 from being oxidized or damaged due to moisture, oxygen, or impurities introduced from the outside may be disposed on the light emitting element 130 and formed by laminating a plurality of encapsulation layers, foreign material compensation layers, and a plurality of barrier films.

The encapsulation layer may be disposed on an entire upper surface of the thin film transistor 120 and the light emitting element 130 and made of one of silicon nitride (SiNx) or aluminum oxide (AlyOz) which is an inorganic material but is not limited thereto. The encapsulation layer may be further disposed on the foreign material compensation layer disposed on the encapsulation layer.

The foreign material compensation layer may be disposed on the encapsulation layer and a silicon oxycarbon (SiOCz), acrylic (acryl), or epoxy (epoxy)-based resin which is an organic material may be used, but is not limited thereto. When a defect occurs due to a crack generated by a foreign material or particles that may be generated during a process, the defect can be compensated by covering bending and the foreign material by the foreign material compensation layer.

A barrier film is disposed on the encapsulation layer and the foreign material compensation layer to delay penetration of oxygen and moisture into the flexible display device 100 from the outside. The barrier film may be configured in a film type having transparency and double-sided adhesiveness, made of any one insulating material of olefin-based, acrylic-based, or silicon-based materials or a barrier film made of any one material of cyclolefin polymer (COP), cyclolefin copolymer (COC), or polycarbonate (PC) may be further laminated, but is not limited thereto.

FIG. 4B illustrates a detailed structure cross-section (II-II') of the bending area BA described in FIG. 3.

Some components of FIG. 4B are substantially the same as and similar to the components described in FIG. 4A and a description thereof will be omitted.

The gate signal and the data signal described in FIGS. 1 to 3 are transmitted to pixels disposed in the display area AA via the circuit wire disposed in the non-display area NA of the flexible display device 100 from the outside to emit light.

When wires disposed in the non-display area NA including the bending area BA of the flexible display device 100 are formed in a single-layer structure, many spaces for disposing the wires are required. After depositing the conductive material, the conductive material is patterned in a shape of the wire by a process such as etching and there is a limit in fineness of an etching process, and as a result, a lot of spaces are required due to a limit for narrowing a distance between the wires, so that the dimension of the non-display area NA increases, which may cause a difficulty in implementing a narrow bezel.

In addition, when one wire is used in order to transmit one signal, the corresponding signal may not be transmitted when the crack occurs in the corresponding wire.

In the process of bending the substrate 111, the crack may occur in the wire itself or the crack occurs on another layer, and as a result, the crack may propagate to the wire. As such, when the crack occurs in the wire, a signal to be transmitted may not be transmitted.

As a result, the wires disposed in the bending area BA of the flexible display device 100 according to an exemplary embodiment of the present disclosure may be disposed as double wires of a first wire 141 and a second wire 142.

The first wire 141 and the second wire 142 may be made of the conductive material and made of a conductive material having excellent flexibility in order to reduce the cracks generated at the time of bending the flexible substrate 111.

The first wire 141 and the second wire 142 may be made of the conductive material having excellent flexibility, such as gold (Au), silver (Ag), aluminum (Al), etc. The first wire 141 and the second wire 142 may be made of one of various conductive materials used in the display area AA and composed even of molybdenum (Mo), chromium (Cr), titanium (Ti), nickel (Ni), neodymium (Nd), copper (Cu), or an alloy of silver (Ag) and magnesium (Mg). In addition, the first wire 141 and the second wire 142 may be configured in a multilayer structure including various conductive materials and may be configured in a three-layered structure of titanium (Ti)/aluminum (Al)/titanium (Ti) but are not limited thereto.

The buffer layer formed by the inorganic insulating layer may be disposed below the first wire 141 and the second wire 142 in order to protect the first wire 141 and the second wire 142 and the passivation layer formed by the inorganic insulating layer is formed so as to surround the upper portion and the lateral portion of the first wire 141 and the second wire 142 to suppress a phenomenon in which the first wire 141 and the second wire 142 react with moisture to be corroded, etc.

When the first wire 141 and the second wire 142 formed in the bending area BA are bent, the first wire 141 and the second wire 142 receive tensile force. As described in FIG. 3, a wire which extends on the substrate 111 in a direction which is the same as the bending direction may receive the largest tensile force and the crack may be generated and when the crack is severe, the disconnection may occur. Therefore, instead of forming the wire to extend in the bending direction, at least a portion of the wire disposed in the bending area BA is formed to extend in an oblique direction different from the bending direction, thereby reducing generation of the crack by reducing the tensile force. The shape of the wire may be constituted by a rhombus shape, a triangular wave shape, a sinusoidal wave shape, a trapezoidal shape, etc., but is not limited thereto.

The first wire 141 may be disposed on the substrate 111 and the first planarization layer 115c may be disposed on the first wire 141. The second wire 142 may be disposed on the first planarization layer 115c and the second planarization layer 115d may be disposed on the second wire 142. The first and second planarization layers 115c and 115d may be made of at least one material of an acrylic resin, an epoxy resin, a phenolic resin, a polyamides resin, a polyimides resin, an unsaturated polyesters resin, a polyphenylene resin, a polyphenylenesulfides resin, or benzocyclobutene, but are not limited thereto.

A micro coating layer (MLC) 145 may be disposed on the second planarization layer 115d.

Since the crack may be generated in the micro coating layer 145 by the tensile force acting on a wiring portion disposed on the substrate 111 when the micro coating layer 145 is bent, the micro coating layer serves to protect the wire by a resin which is coated at a bending location with a thin thickness.

Figure 5:
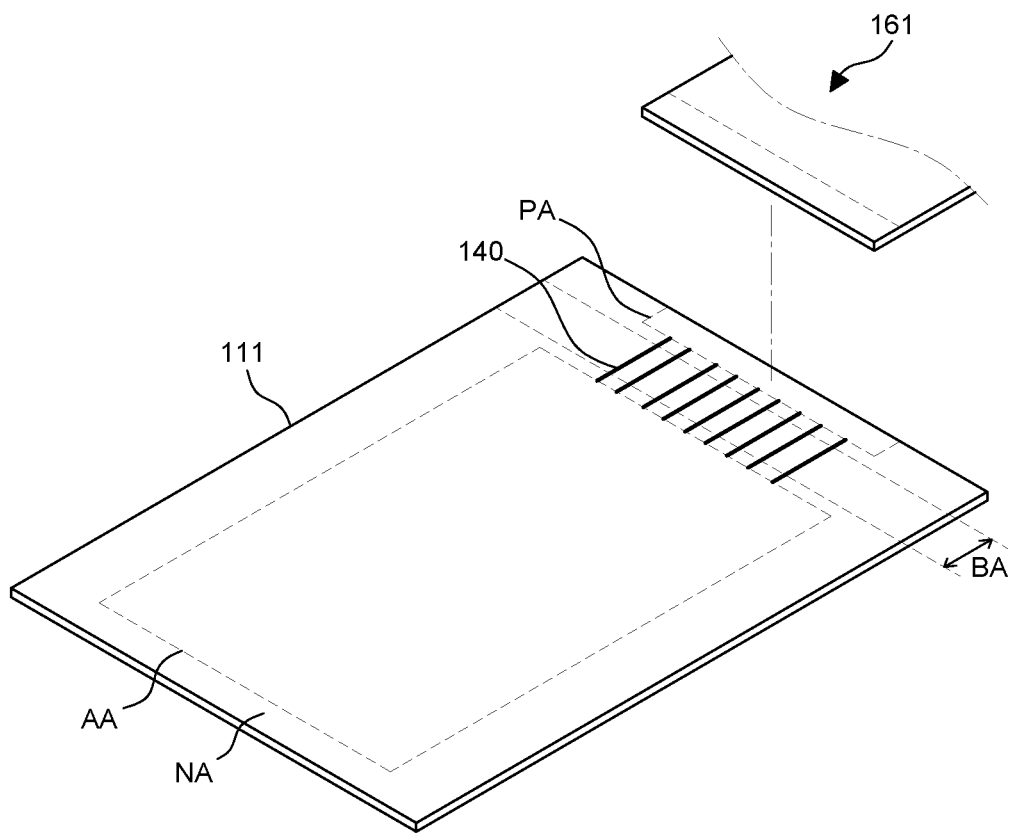
FIG. 5 is a perspective view of a flexible display device according to an exemplary embodiment of the present disclosure.

FIG. 5 is a perspective view of a flexible display device according to an exemplary embodiment of the present disclosure.

Figure 6:
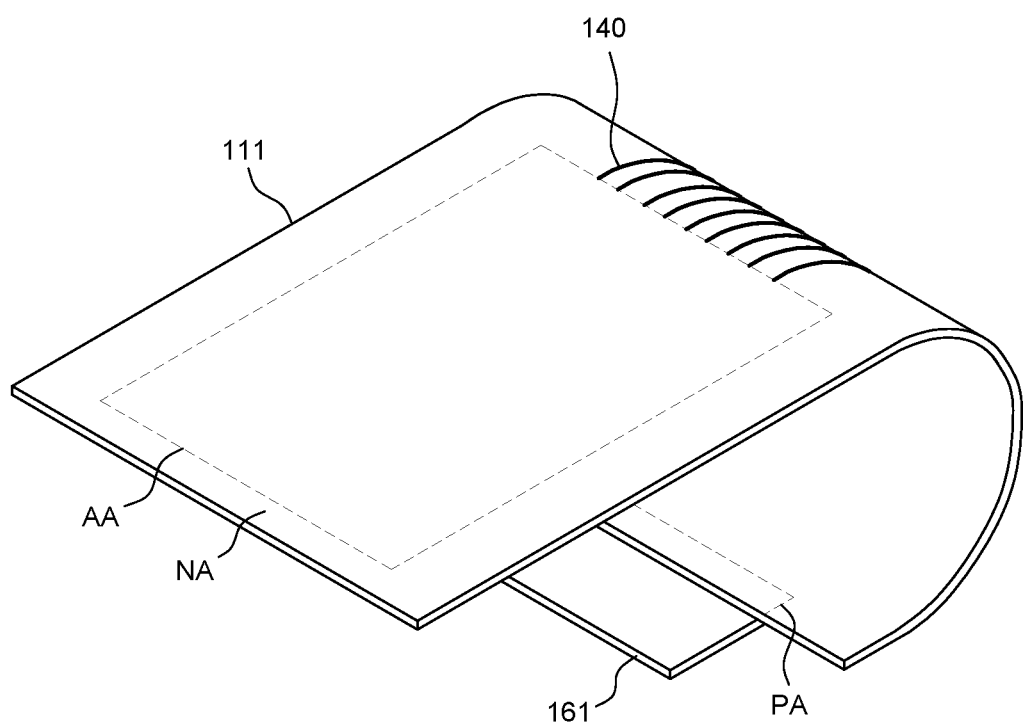
FIG. 6 is a perspective view illustrating a bending state of a flexible display device according to an exemplary embodiment of the present disclosure.

FIG. 6 is a perspective view illustrating a bending state of a flexible display device according to an exemplary embodiment of the present disclosure.

Referring to FIG. 5, the flexible display device 100 according to an exemplary embodiment of the present disclosure may include a substrate 111 and a circuit element 161.

The substrate 111 may be partitioned into a display area AA and a non-display area NA which is a bezel area surrounding the periphery of the display area AA.

The non-display area NA may include a pad area PA outside the display area AA. A plurality of sub pixels may be disposed in the display area AA. The sub pixels are arranged in red (R), green (G), blue (B), or R, G, B, white (W) scheme to implement full colors. The sub pixels may be partitioned by gate lines and data lines which cross each other.

The circuit element 161 may include bumps (or terminals). The bumps of the circuit element 161 may be bonded to pads of the pad area PA, respectively through an anisotropic conductive film. The circuit element 161 may be a chip on film (COF) in which a driving integrated circuit (IC) is mounted on a flexible film. Further, the circuit element 161 may be implemented as a COG type in which the circuit element 161 is directly bonded to the pads on the substrate by a chip on glass (COG) process. Further, the circuit element 161 may be a flexible circuit such as a flexible flat cable (FFC) or a flexible printed circuit (FPC). In the following exemplary embodiment, the COF will be primarily described as an example of the circuit element 161, but the present disclosure is not limited thereto.

The driving signals supplied through the circuit element 161, e.g., the gate signal and the data signal may be supplied to the gate lines and the data lines of the display area AA through the circuit wires 140 such as a routing line.

In the flexible display device 100, a sufficient space at which the pad area PA and the circuit element 161 may be positioned in addition to the display area AA in which an input image is implemented should be secured. Such a space corresponds to the bezel area and the bezel area is perceived by a user positioned on a front surface of the flexible display device 100, which may cause aesthetics to deteriorate somewhat.

Referring to FIG. 6, the flexible display device 100 according to an exemplary embodiment of the present disclosure may be bent in a rear surface direction so that one periphery of the substrate 111 has a predetermined curvature.

One periphery of the substrate 111 may correspond to an outer portion of the display area AA and correspond to an area where the pad area PA is positioned. As the substrate 111 is bent, the pad area PA may be positioned to overlap with the display area AA in the rear direction of the display area AA. As a result, the bezel area perceived on the front surface of the flexible display device 100 may be minimized.

To this end, the substrate 111 may be made of a flexible material which may be bent. For example, the substrate 111 may be made of a plastic material such as polyimide (PI). Further, the circuit wire 140 may be made of a material having flexibility. For example, the circuit wire 140 may be made of a material such as a metal nano wire, a metal mesh, or a carbon nanotube (CNT). However, the circuit wire 140 is not limited thereto.

The circuit wires 140 may extend from the display area AA and may be disposed in the bending area BA. In other words, the circuit wire 140 may extend along the outer circumference of the substrate 111. Since the circuit wires 140 are positioned in a bent area so as to have a predetermined curvature, the circuit wires 140 are likely to have the crack or to be opened by stress applied during bending.

More specifically, when one periphery of the substrate 111 is bent, a neutral plane NP is positioned on the substrate 111 in the bending area BA. The neutral plane NP as a plane in which a stress state becomes substantially zero during bending means a plane that does not increase or decrease in length but is bent while maintaining an original length whenever a bending moment is applied. During bending, compressive stress acts on the inside of a bending curvature and tensile stress acts on the outside and the crack is generated more easily in an element disposed in an area where the tensile stress acts than in an element disposed in an area where the compressive stress acts. In other words, the elements are more vulnerable to crack generation in the case of receiving the tensile stress than in the case of receiving the compressive stress.

In a structure in which the periphery of the substrate 111 is bent, since the circuit wires 140 receive the tensile stress during bending, a defect is likely to occur due to the crack, etc., in the bending area.

Figure 7:
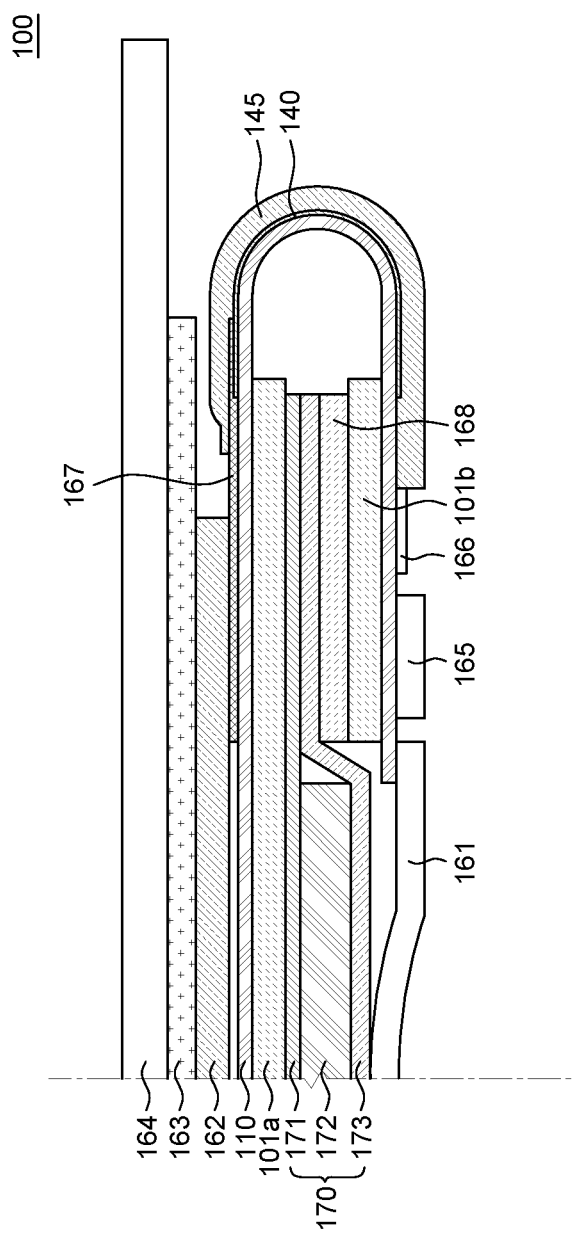
FIG. 7 is a diagram illustrating a cross-sectional structure of a flexible display device according to an exemplary embodiment of the present disclosure.

FIG. 7 is a diagram illustrating a cross-sectional structure of a flexible display device according to an exemplary embodiment of the present disclosure.

Referring to FIG. 7, the flexible display device 100 according to an exemplary embodiment of the present disclosure may include a display panel 110, a circuit element 161, a polarizing plate 162, and a cover glass 164.

The display panel 110 may include a first planar portion, a second planar portion, and a curve portion positioned between the first planar portion and the second planar portion. The first planar portion is an area that corresponds to the display area AA having a plurality of sub pixels and maintains a flat state. The second planar portion is an area facing the first planar portion and an area which corresponds to the pad area PA having the pads bonded to the circuit element 161 and maintains the flat state. The curve portion is an area where circuit wires 140 connecting the display area AA and the pad area PA are provided and an area that maintains a bending state with a predetermined curvature.

In this case, for example, the curve portion may have a shape of "⊃" (e.g., a U shape). In other words, the curve portion may extend from the first planar portion and may be bent 180 degrees in the rear direction, and as a result, the second planar portion which extends from the curve portion may be positioned to overlap with the first planar portion in the rear direction of the first planar portion. In other words, the circuit element 161 bonded to the display panel 110 in the second planar portion may be positioned in the rear direction of the display panel 110 of the first planar portion.

Although not illustrated, the barrier film may be disposed on the display panel 110.

The barrier film as a component for protecting various components of the display panel 110 may be disposed to correspond to at least the display area AA of the display panel 110. The barrier film is not a particularly required component and may be deleted according to the structure of the flexible display device 100. The barrier film may be composed to include a material having adhesiveness and the material having the adhesiveness may be a heat-curable or self-curable adhesive, and since the barrier film may be made of a material such as a pressure sensitive adhesive (PSA), the barrier film may serve to fix the polarizing plate 162 onto the barrier film.

The polarizing plate 162 disposed on the barrier film may suppress reflection of external light on the display area AA. When the display device 100 is externally used, external natural light may be introduced and reflected by the reflective layer included in the anode of the electroluminescent element or reflected by an electrode made of metal disposed below the electroluminescent element. An image of the display device 100 may not be well viewed by the reflected light. The polarizing plate 162 polarizes the light introduced from the outside in a specific direction and suppresses the reflected light from being emitted to the outside of the display device 100 again. The polarizing plate 162 may be disposed on the display area AA but is not limited thereto.

The polarizing plate 162 may be a polarizing plate constituted by a polarizer and a protective film for protecting the polarizer and may be formed by coating a polarizing material for flexibility.

An adhesive layer 163 is disposed on the polarizing plate 162 to bond and dispose the cover glass 164 for protecting an exterior of the display device 100. In other words, the cover glass 164 is provided to cover the front surface of the display panel 110 to serve to protect the display panel 110.

The adhesive layer 163 may include an optically clear adhesive (OCA).

A light blocking pattern 167 may be formed on four peripheral surfaces of the display panel 110.

The light blocking pattern 167 may be formed on a top periphery of the display panel 110.

The light blocking pattern 167 may be formed to overlap with parts of the polarizing plate 162 and the display panel 110 between the polarizing plate 162 and the display panel 110. However, the light blocking pattern 167 is not limited thereto.

The light blocking pattern 167 may be applied with black ink.

Although not illustrated, a touch screen panel may be further provided on the display panel 110. In this case, the polarizing plate 162 may be positioned on the touch screen panel. When the display panel 110 includes the touch screen panel, the cover glass 164 may be provided to cover at least a part of the touch screen panel.

The touch screen panel includes a plurality of touch sensors. The touch sensor may be disposed at a location corresponding to the display area AA of the display panel 110. The touch sensor may include at least any one of a mutual capacitance sensor and a magnetic capacitance sensor.

The mutual capacitance sensor includes a mutual capacitance formed between two touch electrodes. A mutual capacitive sensing circuit may apply a driving signal (or a stimulus signal) to any one of two electrodes and sense a touch input based on an electric charge change amount of the mutual capacitance through the other electrode. When a conductor closely approaches the mutual capacitance, an electric charge amount of the mutual capacitance is reduced, and as a result, the touch input or a gesture may be sensed.

The magnetic capacitance sensor includes a magnetic capacitance formed in sensor electrodes, respectively. The magnetic capacitive sensing circuit may supply an electric charge to each of the sensor electrodes and sense the touch input based on an electric charge change amount of the magnetic capacitance. When the conductor closely approaches the magnetic capacitance, a capacitance by the conductor is connected to the capacitance of the sensor in parallel to increase a capacitance value. Accordingly, in the case of the magnetic capacitance, when the touch input is sensed, the capacitance value of the sensor increases.

Back plates 101a and 101b may be disposed at a lower portion of the display panel 110. When the substrate of the display panel 110 is made of a plastic material such as polyimide, a manufacturing process of the flexible display device 100 may be performed in a situation in which a support substrate made of glass is disposed below the display panel 110 and after the manufacturing process is completed, the support substrate may be separated and released.

Since a component for supporting the display panel 110 is required even after the support substrate is released, the back plates 101a and 101b for supporting the display panel 110 may be disposed below the display panel 110.

The back plates 101a and 101b may serve to suppress a foreign material from being attached to the lower portion of the substrate and buffer an impact from the outside.

The back plates 101a and 101b may be disposed adjacent to the bending area BA in other areas of the display panel 110 except for the bending area BA.

The back plates 101a and 101b may include a first back plate 101a and a second back plate 101b positioned on rear surfaces of the first planar portion and the second planar portion, respectively. The first back plate 101a reinforces the rigidity of the first planar portion to allow the first planar portion to maintain the flat state. The second back plate 101b reinforces the rigidity of the second planar portion to allow the second planar portion to maintain the flat state. Meanwhile, in order to secure the flexibility of the curve portion and to facilitate the control of the neutral plane using the micro coating layer 145, it is preferable that the back plates 101a and 101b are not positioned on the rear surface of the curve portion.

The back plates 101a and 101b may be formed by a plastic thin film made of polyimide (PI), polyethylene naphthalate (PEN), polyethylene terephthalate (PET), polymers, combinations of the polymers, and the like.

A support member 170 may be disposed between the two back plates 101a and 101b and the support member 170 may be bonded to the back plates 101a and 101b by an adhesive tape 168.

The support member 170 of the present disclosure may be constituted by an adhesive 171, a cushion tape 172, and a heat dissipation sheet 173.

The adhesive 171 may be attached to the rear surface of the first back plate 101a.

The adhesive 171 may have an embossing pattern.

The adhesive 171 may be made of pressure sensitive adhesive (PSA).

In the adhesive 171, a pattern-shaped air channel may be formed in the PSA and bubbles may be removed along a channel when attached to the rear surface of the first back plate 101a.

There should be no phenomenon in which an adhesive force of the adhesive 171 deteriorates when evaluating reliability such that the adhesive 171 can be attached to an entire area of the first back plate 101a.

The adhesive 171 may have the embossing pattern in order to improve bubble removal or waterproof at the time of attaching the adhesive 171 to the rear surface of the first back plate 101a.

When the cushion tape 172 receives external force, the cushion tape 172 is compressed to serve to absorb the impact. When the impact is evaluated, a rear surface may be protected from the middle frame and the damage of the rear surface caused by the middle frame may be reduced.

The cushion tape 172 may reduce the impact by approximately 16.1% when a point impact occurs by dropping a 21.7 g ball at a height of 30 cm.

The cushion tape 172 of the present disclosure is attached to only a part of the rear surface of the adhesive 171.

In a bezel bending model in which the bezel area is bent, the curvature R of the curve portion is determined according to the thickness of the support member 170, i.e., the thicknesses of the adhesive 171 and the cushion tape 172. When an inner thickness of the curve portion increases, the curvature R also increases, so that the width of the bezel area BA also increases.

Therefore, in the support member 170 of the present disclosure, the adhesive tape 168 is attached to the corresponding area by removing a part of the cushion tape 172. Accordingly, provided is an effect that the curvature R value of the bezel area BA is decreased to reduce the bezel width. Further, the thickness of the cushion tape 172 may be increased in the same bezel width, thereby effectively absorbing the impact by the external force.

The heat dissipation sheet 173 may serve to function heat dissipation, and to protect a ground and the rear surface.

The heat dissipation sheet 173 may be configured by a composite heat dissipation sheet.

The heat dissipation sheet 173 may diffuse the heat of the driving IC 165 and set components to lower the temperature of the flexible display device 100, thereby enhancing an element lifespan. A temperature of 2 to 3° C. may be reduced when the heat dissipation sheet 173 is attached.

The heat dissipation sheet 173 may have a thermal conductivity of 3000 W/mK or more.

The heat dissipation sheet 173 may be configured by laminating graphite mixed with powder and copper layers.

The heat dissipation sheet 173 may be attached to the rear surface of the cushion tape 172 of the support member 170. Further, the heat dissipation sheet 173 may be directly attached to the rear surface of the adhesive 171 of the support member 170 from which the cushion tape 172 is removed.

The micro coating layer 145 may be disposed on an upper portion of the bending area BA of the display panel 110. The micro coating layer 145 may be formed to cover one side of the barrier film.

When the tensile force acts on the circuit wire 140 disposed on the display panel 110 and the crack may be thus generated during bending, the micro coating layer 145 may serve to protect the wire by forming a resin having a small thickness at the bending location.

The micro coating layer 145 may be made of an acrylic material such as an acrylate polymer. However, the micro coating layer 145 is not limited thereto.

The micro coating layer 145 may adjust the neutral plane of the bending area BA.

When the structure is bent as described above, the neutral plane may mean a virtual plane that does not receive the stress because the compressive force and the tensile force applied to the structure are offset with each other. When two or more structures are laminated, a virtual neutral plane may be formed between the structures. When the entire structure is bent in one direction, structures disposed in the bending direction based on the neutral plane are compressed by bending, and as a result, the structures receive the compressive force. Contrary to this, since structures disposed in a direction opposite to the bending direction based on the neutral plane are stretched by bending, the structures receive the tensile force. In addition, when the structures receive the tensile force among the same compressive force and tensile force, the structures are more vulnerable, and as a result, when the structures receive the tensile force, there is a higher probability that the crack will be generated.

Since the flexible substrate of the display panel 110 disposed below the neutral plane is compressed, the flexible substrate may receive the compressive force and the circuit wires 140 disposed above the neutral plane may receive the tensile force and the crack may be generated by the tensile force. Accordingly, the circuit wire 140 may be positioned on the neutral plane in order to minimize the tensile force received by the circuit wire 140.

The micro coating layer 145 is disposed above the bending area BA to raise the neutral plane in the upper direction and the neutral plane is formed at the same location as the circuit wire 140 or positioned at a higher location than the neutral plane so that the micro coating layer does not receive the stress or receives the compressive force during bending, thereby suppressing the generation of the crack.

The circuit element 161 may be connected to the end of the second planar portion of the display panel 110.

Various wires for transmitting the signal to the pixels disposed in the display area AA may be formed on the circuit element 161.

The circuit element 161 may be made of a material having flexibility so as to be bent.

The driving IC 165 may be mounted on the second planar portion of the display panel 110 and the driving IC 165 is connected to the wires formed on the circuit element 161 to provide the driving signal and data to the sub pixels disposed in the display area AA.

The circuit element 161 may be a flexible printed circuit board (FPCB).

The circuit element 161 may have a curve to be inclined toward the cushion tape 172 of the support member 170 by considering a step.

One end of the circuit element 161 may be connected to the display panel 110 and the other end may be bent and attached to the support member 170.

Meanwhile, the micro coating layer 145 according to an exemplary embodiment of the present disclosure may be formed to cover one side of the barrier film above the bending area BA of the display panel 110 and additionally, the micro coating layer 145 may extend to cover the side surface of the polarizing plate 162 in order to further suppress the generation of the crack and this will be described in detail through other exemplary embodiments of the present disclosure.

Figure 8:
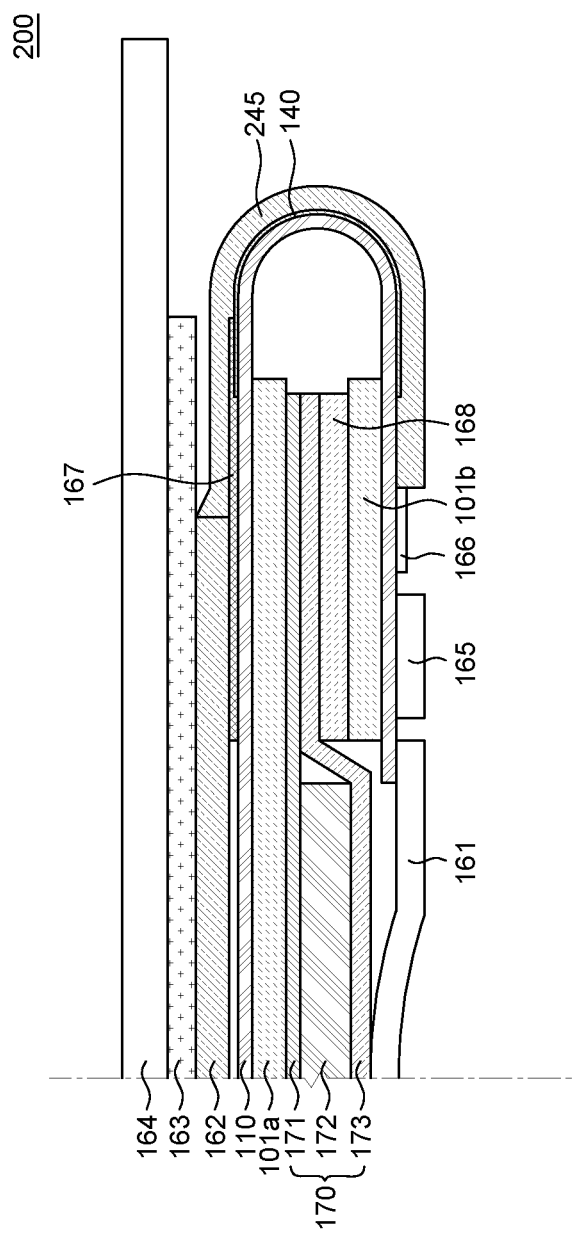
FIG. 8 is a diagram illustrating a cross-sectional structure of a flexible display device according to another exemplary embodiment of the present disclosure.

FIG. 8 is a diagram illustrating a cross-sectional structure of a flexible display device according to another exemplary embodiment of the present disclosure.

A flexible display device 200 according to another exemplary embodiment of the present disclosure in FIG. 8 has substantially the same components as the flexible display device 100 according to an exemplary embodiment of the present disclosure in FIG. 7 except for a micro coating layer 245. Accordingly, like reference numerals refer to like components.

Referring to FIG. 8, the flexible display device 200 according to another exemplary embodiment of the present disclosure may include a display panel 110, a circuit element 161, a polarizing plate 162, and a cover glass 164.

The display panel 110 may include a first planar portion, a second planar portion, and a curve portion positioned between the first planar portion and the second planar portion. The first planar portion is an area that corresponds to the display area AA having a plurality of sub pixels and maintains a flat state. The second planar portion is an area facing the first planar portion and an area which corresponds to the pad area PA having the pads bonded to the circuit element 161 and maintains the flat state. The curve portion is an area where circuit wires 140 connecting the display area AA and the pad area PA are provided and an area that maintains a bending state with a predetermined curvature.

The polarizing plate 162 may be disposed on the display panel 110.

An adhesive layer 163 is disposed on the polarizing plate 162 to bond and dispose the cover glass 164 for protecting an exterior of the display device 200.

Back plates 101a and 101b may be disposed at a lower portion of the display panel 110.

The back plates 101a and 101b may be disposed adjacent to the bending area BA in other areas of the display panel 110 except for the bending area BA.

The back plates 101a and 101b may include a first back plate 101a and a second back plate 101b positioned on rear surfaces of the first planar portion and the second planar portion, respectively. The first back plate 101a reinforces the rigidity of the first planar portion to allow the first planar portion to maintain the flat state. The second back plate 101b reinforces the rigidity of the second planar portion to allow the second planar portion to maintain the flat state. Meanwhile, in order to secure the flexibility of the curve portion and to facilitate the control of the neutral plane using the micro coating layer 245, it is preferable that the back plates 101a and 101b are not positioned on the rear surface of the curve portion.

A support member 170 may be disposed between the two back plates 101a and 101b and the support member 170 may be bonded to the back plates 101a and 101b by an adhesive tape 168.

The support member 170 of the present disclosure may be constituted by an adhesive 171, a cushion tape 172, and a heat dissipation sheet 173.

The adhesive 171 may be attached to the rear surface of the first back plate 101a.

The adhesive 171 may have an embossing pattern.

The adhesive 171 may be made of pressure sensitive adhesive (PSA).

In the adhesive 171, a pattern-shaped air channel may be formed in the PSA and bubbles may be removed along a channel when attached to the rear surface of the first back plate 101a.

There should be no phenomenon in which an adhesive force of the adhesive 171 deteriorates when evaluating reliability such that the adhesive 171 can be attached to an entire area of the first back plate 101a.

The adhesive 171 may have the embossing pattern in order to improve bubble removal or waterproof at the time of attaching the adhesive 171 to the rear surface of the first back plate 101a.

When the cushion tape 172 receives external force, the cushion tape 172 is compressed to serve to absorb the impact. When the impact is evaluated, a rear surface may be protected from the middle frame and the damage of the rear surface caused by the middle frame may be reduced.

The cushion tape 172 of the present disclosure is attached to only a part of the rear surface of the adhesive 171. In other words, in the support member 170 of the present disclosure, the adhesive tape 168 is attached to the corresponding area by removing a part of the cushion tape 172. Accordingly, provided is an effect that the curvature R value of the bezel area BA is decreased to reduce the bezel width. Further, the thickness of the cushion tape 172 may be increased in the same bezel width, thereby effectively absorbing the impact by the external force.

The heat dissipation sheet 173 may serve to function heat dissipation and to protect a ground and the rear surface.

The heat dissipation sheet 173 may be configured by a composite heat dissipation sheet.

The heat dissipation sheet 173 may have a thermal conductivity of 3000 W/mK or more.

The heat dissipation sheet 173 may be configured by laminating graphite mixed with powder and copper layers.

The heat dissipation sheet 173 may be attached to the rear surface of the cushion tape 172 of the support member 170. Further, the heat dissipation sheet 173 may be directly attached to the rear surface of the adhesive 171 of the support member 170 from which the cushion tape 172 is removed.

The micro coating layer 245 may be disposed on an upper portion of the bending area BA of the display panel 110. The micro coating layer 245 may be formed to cover one side of the barrier film.

The micro coating layer 245 may be made of an acrylic material such as an acrylate polymer. However, the micro coating layer 245 is not limited thereto.

The micro coating layer 245 may adjust the neutral plane of the bending area BA.

The micro coating layer 245 according to another exemplary embodiment of the present disclosure may extend to cover the side surface of the polarizing plate 162.

A part of the micro coating layer 245, which covers the side surface of the polarizing plate 162 may have a larger thickness than other parts but is not limited thereto.

The part of the micro coating layer 245 covering the side surface of the polarizing plate 162 may be in contact with the adhesive layer 163 thereon.

As a result, the micro coating layer 245 according to another exemplary embodiment of the present disclosure may further suppress the generation of the crack.

The circuit element 161 may be connected to the end of the second planar portion of the display panel 110.

Various wires for transmitting the signal to the pixels disposed in the display area AA may be formed on the circuit element 161.

The driving IC 165 may be mounted on the second planar portion of the display panel 110 and the driving IC 165 is connected to the wires formed on the circuit element 161 to provide the driving signal and data to the sub pixels disposed in the display area AA.

The circuit element 161 may be a flexible printed circuit board (FPCB).

The circuit element 161 may have a curve to be inclined toward the cushion tape 172 of the support member 170 by considering a step.

One end of the circuit element 161 may be connected to the display panel 110 and the other end may be bent and attached to the support member 170.

Meanwhile, set components of the middle frame may be additionally attached to the lower portions of the flexible display devices 100 and 200 of the present disclosure and this will be described in detail through yet another exemplary embodiment of the present disclosure.

Figure 9:
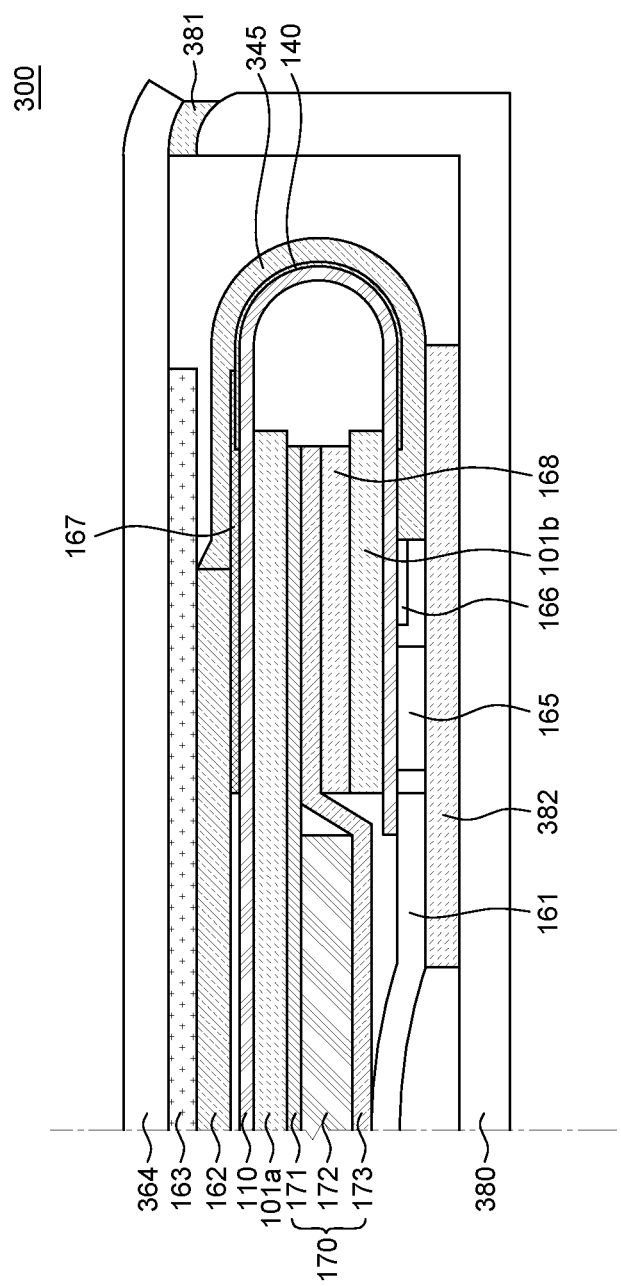
FIG. 9 is a diagram illustrating a cross-sectional structure of a flexible display device according to yet another exemplary embodiment of the present disclosure.

FIG. 9 is a diagram illustrating a cross-sectional structure of a flexible display device according to yet another exemplary embodiment of the present disclosure.

A flexible display device 300 according to yet another exemplary embodiment of the present disclosure in FIG. 9 has substantially the same components as the flexible display devices 100 and 200 according to an exemplary embodiment and another exemplary embodiment of the present disclosure in FIGS. 7 and 8 except for a cover glass 364 and a middle frame 380.

Accordingly, like reference numerals refer to like components and a part of the description will be omitted.

Referring to FIG. 9, the flexible display device 300 according to yet another exemplary embodiment of the present disclosure may include a display panel 110, a circuit element 161, a polarizing plate 162, and a cover glass 364.

The polarizing plate 162 may be disposed on the display panel 110.

An adhesive layer 163 is disposed on the polarizing plate 162 to bond and dispose the cover glass 364 for protecting an exterior of the display device 300.

At least one side of the cover glass 364 according to yet another exemplary embodiment of the present disclosure may be bent down.

Back plates 101a and 101b may be disposed at a lower portion of the display panel 110.

A support member 170 may be disposed between the two back plates 101a and 101b and the support member 170 may be bonded to the back plates 101a and 101b by an adhesive tape 168.

The support member 170 of the present disclosure may be constituted by an adhesive 171, a cushion tape 172, and a heat dissipation sheet 173.

The adhesive 171 may be attached to the rear surface of the first back plate 101a.

The adhesive 171 may have an embossing pattern.

The adhesive 171 may be made of pressure sensitive adhesive (PSA).

In the adhesive 171, a pattern-shaped air channel may be formed in the PSA and bubbles may be removed along a channel when attached to the rear surface of the first back plate 101a.

There should be no phenomenon in which an adhesive force of the adhesive 171 deteriorates when evaluating reliability such that the adhesive 171 can be attached to an entire area of the first back plate 101a.

The adhesive 171 may have the embossing pattern in order to improve bubble removal or waterproof at the time of attaching the adhesive 171 to the rear surface of the first back plate 101a.

When the cushion tape 172 receives external force, the cushion tape 172 is compressed to serve to absorb the impact. When the impact is evaluated, a rear surface may be protected from the middle frame and the damage of the rear surface caused by the middle frame may be reduced.

The cushion tape 172 of the present disclosure is attached to only a part of the rear surface of the adhesive 171. In other words, in the support member 170 of the present disclosure, the adhesive tape 168 is attached to the corresponding area by removing a part of the cushion tape 172. Accordingly, provided is an effect that the curvature R value of the bezel area BA is decreased to reduce the bezel width. Further, the thickness of the cushion tape 172 may be increased in the same bezel width, thereby effectively absorbing the impact by the external force.

The heat dissipation sheet 173 may serve to function heat dissipation and to protect a ground and the rear surface.

The heat dissipation sheet 173 may be configured by a composite heat dissipation sheet.

The heat dissipation sheet 173 may have a thermal conductivity of 3000 W/mK or more.

The heat dissipation sheet 173 may be configured by laminating graphite mixed with powder and copper layers.

The heat dissipation sheet 173 may be attached to the rear surface of the cushion tape 172 of the support member 170. Further, the heat dissipation sheet 173 may be directly attached to the rear surface of the adhesive 171 of the support member 170 from which the cushion tape 172 is removed.

The micro coating layer 345 may be disposed on an upper portion of the bending area BA of the display panel 110. The micro coating layer 345 may be formed to cover one side of the barrier film.

The micro coating layer 345 may be made of an acrylic material such as an acrylate polymer. However, the micro coating layer 345 is not limited thereto.

The micro coating layer 345 may adjust the neutral plane of the bending area BA.

The micro coating layer 345 according to yet another exemplary embodiment of the present disclosure may extend to cover the side surface of the polarizing plate 162 similarly to other exemplary embodiments.

A part of the micro coating layer 345, which covers the side surface of the polarizing plate 162 may have a larger thickness than other parts but is not limited thereto.

The part of the micro coating layer 345 covering the side surface of the polarizing plate 162 may be in contact with the adhesive layer 163 thereon.

As a result, the micro coating layer 345 according to yet another exemplary embodiment of the present disclosure may further suppress the generation of the crack.

The circuit element 161 may be connected to the end of the second planar portion of the display panel 110.

The circuit element 161 may have a curve to be inclined toward the cushion tape 172 of the support member 170 by considering a step.

One end of the circuit element 161 may be connected to the display panel 110 and the other end may be bent and attached to the support member 170.

A set component of a middle frame 380 may be additionally attached to the lower portion of the flexible display device 300 according to yet another exemplary embodiment of the present disclosure.

The middle frame 380 may have a flat bottom surface and a vertical surface which vertically protrudes from the bottom surface on the periphery.

The bottom surface of the middle frame 380 may be attached onto the rear surfaces of the circuit element 161 and the micro coating layer 345 by a bonding means 382 of the resin or a tape, but the middle frame 380 is not limited thereto.

Further, an upper portion of a vertical surface of the middle frame 380 may be attached onto one side of the bent cover glass 364 by another bonding means 381 of the resin or tape, but the middle frame 380 is not limited thereto.

Although not illustrated, the upper portion of the vertical surface of the middle frame 380 may be bent several times and the resin may be filled in the bent upper portion of the vertical surface.

The exemplary embodiments of the present disclosure can also be described as follows:

According to an aspect of the present disclosure, there is provided a flexible display device. The flexible display device includes a display panel including a display area and a bending area which extends on one side of the display area and is bent, first and second back plates disposed on a rear surface of the display panel; a thin film transistor and a light emitting element disposed on the display area, a circuit wire disposed on the display area and the bending area, a micro coating layer disposed on the circuit wire of the bending area, and a support member disposed between the first and second back plates and including an adhesive, a cushion tape attached to a part of a rear surface of the adhesive, and a heat dissipation sheet attached to rear surfaces of the cushion tape and the adhesive.

The adhesive may be attached to a rear surface of the first back plate.

The adhesive may have an embossing pattern.

The adhesive may be made of a pressure sensitive adhesive (PSA).

An air channel may be patterned in the PSA and when the adhesive is attached onto a rear surface of the first back plate, bubbles may be removed along the air channel.

The cushion tape may be attached onto only a part of the rear surface of the adhesive, and the heat dissipation sheet may be attached to the cushion tape and the rear surface of the adhesive of the support member from which the cushion tape is removed.

The flexible display device may further include an adhesive tape attached to a rear surface of the heat dissipation sheet of the support member from which the cushion tape is removed.

The flexible display device may further include a circuit element connected to an end of the display panel.

The circuit element may have a curve inclined toward the cushion tape.

One end of the circuit element may be connected to the display panel and another end may be bent and attached to the support member.

The flexible display device may further include a polarizing plate disposed on the display panel and a cover glass attached to the polarizing plate through an adhesive layer.

The micro coating layer may extend to cover a side surface of the polarizing plate on the display area of the display panel.

A part of the micro coating layer, which covers the side surface of the polarizing plate, may have a larger thickness than other parts of the micro coating layer.

The part of the micro coating layer covering the side surface of the polarizing plate may be in contact with the adhesive layer.

The flexible display device may further include a middle frame having a bottom surface that is attached to rear surfaces of the circuit element and the micro coating layer by a bonding means.

The middle frame may be attached to one side of a cover glass, and an upper portion of a vertical surface of the cover glass may be bent down by another bonding means.

According to another aspect of the present disclosure, there is provided a flexible display device. The flexible display device includes a display panel including a first planar portion, a second planar portion, and a curve portion positioned between the first planar portion and the second planar portion, first and second back plates disposed on rear surfaces of the first and second planar portions of the display panel, respectively, a support member disposed between the first and second back plates and including an adhesive, a cushion tape attached to a part of a rear surface of the adhesive, and a heat dissipation sheet attached to rear surfaces of the cushion tape and the adhesive, and an adhesive tape disposed between the heat dissipation sheet attached onto the rear surface of the adhesive and the second back plate.

The flexible display device may further include a circuit wire disposed on the first planar portion and the curve portion and a micro coating layer disposed on the circuit wire of the curve portion.

The flexible display device may further include a polarizing plate disposed on the display panel.

The micro coating layer may extend to cover a side surface of the polarizing plate on the first planar portion of the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present

What is claimed is:

1. A flexible display device comprising:
a display panel including a display area and a bending area which extends on one side of the display area and is bent;
first and second back plates disposed on a rear surface of the display panel;
a thin film transistor and a light emitting element disposed on the display area;
a circuit wire disposed on the display area and the bending area;
a micro coating layer disposed on the circuit wire of the bending area; and
a support member disposed between the first and second back plates and including an adhesive, a cushion tape attached to a part of a rear surface of the adhesive, and a heat dissipation sheet attached to rear surfaces of the cushion tape and the adhesive.

2. The flexible display device according to claim 1, wherein the adhesive is attached to a rear surface of the first back plate.

3. The flexible display device according to claim 1, wherein the adhesive has an embossing pattern.

4. The flexible display device according to claim 1, wherein the adhesive is made of a pressure sensitive adhesive (PSA).

5. The flexible display device according to claim 4, wherein an air channel is patterned in the PSA.

6. The flexible display device according to claim 1, wherein the cushion tape is attached onto only a part of the rear surface of the adhesive, and
the heat dissipation sheet is attached to the cushion tape and the rear surface of the adhesive of the support member from which the cushion tape is removed.

7. The flexible display device according to claim 6, further comprising:
an adhesive tape attached to a rear surface of the heat dissipation sheet of the support member from which the cushion tape is removed.

8. The flexible display device according to claim 1, further comprising:
a circuit element connected to an end of the display panel.

9. The flexible display device according to claim 8, wherein the circuit element has a curve inclined toward the cushion tape.

10. The flexible display device according to claim 8, wherein one end of the circuit element is connected to the display panel and another end is bent and attached to the support member.

11. The flexible display device according to claim 8, further comprising:
a polarizing plate disposed on the display panel; and
a cover glass attached to the polarizing plate through an adhesive layer.

12. The flexible display device according to claim 11, wherein the micro coating layer extends to cover a side surface of the polarizing plate on the display area of the display panel.

13. The flexible display device according to claim 12, wherein a part of the micro coating layer, which covers the side surface of the polarizing plate, has a larger thickness than other parts of the micro coating layer.

14. The flexible display device according to claim 13, wherein the part of the micro coating layer covering the side surface of the polarizing plate is in contact with the adhesive layer.

15. The flexible display device according to claim 8, further comprising:
a middle frame having a bottom surface that is attached to rear surfaces of the circuit element and the micro coating layer by a bonding means.

16. The flexible display device according to claim 15, wherein the middle frame is attached to one side of a cover glass, and an upper portion of a vertical surface of the cover glass is bent down by another bonding means.

17. A flexible display device comprising:
a display panel including a first planar portion, a second planar portion, and a curve portion positioned between the first planar portion and the second planar portion;
first and second back plates disposed on rear surfaces of the first and second planar portions of the display panel, respectively;
a support member disposed between the first and second back plates and including an adhesive, a cushion tape attached to a part of a rear surface of the adhesive, and a heat dissipation sheet attached to rear surfaces of the cushion tape and the adhesive; and
an adhesive tape disposed between the heat dissipation sheet attached onto the rear surface of the adhesive and the second back plate.

18. The flexible display device according to claim 17, further comprising:
a circuit wire disposed on the first planar portion and the curve portion; and
a micro coating layer disposed on the circuit wire of the curve portion.

19. The flexible display device according to claim 18, further comprising:
a polarizing plate disposed on the display panel.

20. The flexible display device according to claim 19, wherein the micro coating layer extends to cover a side surface of the polarizing plate on the first planar portion of the display panel.

* * * * *